United States Patent
Yamaguchi

[11] Patent Number: 5,886,876
[45] Date of Patent: Mar. 23, 1999

[54] SURFACE-MOUNTED SEMICONDUCTOR PACKAGE AND ITS MANUFACTURING METHOD

[75] Inventor: Tadashi Yamaguchi, Tokyo, Japan

[73] Assignee: OKI Electric Industry Co., Ltd., Tokyo, Japan

[21] Appl. No.: 760,473

[22] Filed: Dec. 5, 1996

[30] Foreign Application Priority Data

Dec. 13, 1995 [JP] Japan ................................ 6-324138

[51] Int. Cl.⁶ .................... H01L 23/12; H05K 5/03
[52] U.S. Cl. ............. 361/767; 361/748; 361/771; 361/783; 257/704; 257/729; 174/52.4; 174/255
[58] Field of Search ................... 361/748, 816, 361/818, 767, 768, 717–720, 722, 782, 783, 771; 174/255, 256, 35 R, 52.1, 52.4, 260, 262, 266, 35 GC; 257/729, 704, 659, 660, 693, 723, 724, 725, 728, 730–732, 737, 738

[56] References Cited

U.S. PATENT DOCUMENTS

| | | | |
|---|---|---|---|
| 3,735,211 | 5/1973 | Kapnias | 257/729 |
| 4,082,894 | 4/1978 | Gedney et al. | 174/52.4 |
| 4,251,852 | 2/1981 | Ecker et al. | 361/718 |
| 4,707,565 | 11/1987 | Kasai et al. | 174/255 |
| 4,819,041 | 4/1989 | Redmond | 257/687 |
| 5,006,667 | 4/1991 | Lonka | 174/35 R |
| 5,031,025 | 7/1991 | Braun et al. | 257/731 |
| 5,060,844 | 10/1991 | Behun et al. | 228/180.21 |
| 5,153,379 | 10/1992 | Guzuk et al. | 174/35 R |
| 5,642,262 | 6/1997 | Terrill et al. | 361/783 |
| 5,686,172 | 11/1997 | Ohya et al. | 174/255 |

FOREIGN PATENT DOCUMENTS

| | | | |
|---|---|---|---|
| 58-79706 A | 5/1983 | Japan | 336/192 |
| 61-024253 A | 2/1986 | Japan | 257/704 |
| 01-135099 A | 5/1989 | Japan | 174/35 R |
| 1-135099 A | 5/1989 | Japan | 174/35 R |

*Primary Examiner*—Leo P. Picard
*Assistant Examiner*—John B. Vigushin
*Attorney, Agent, or Firm*—Rabin & Champagne, P.C.

[57] ABSTRACT

The semiconductor package contains the substrate with a stacked structure; the semiconductor device mounted on the top of the substrate and provided with the electrode pads; the input/output terminals on the bottom of the substrate, which connects the semiconductor package to the printed circuit board; and the conductive tubes going through the substrate, which connects the input/output terminals and the electrode pads. The surface-mounted semiconductor package has the protecting device on its sides. The protect device prevents water and the like from infiltrating the edges of the substrate, and additionally avoid a crack of the substrate due to expansion of the water. Furthermore, the protecting device has the pairs of lands on both sides of the substrate, which fasten the edges of the substrate.

2 Claims, 7 Drawing Sheets

SURFACE-MOUNTED SEMICONDUCTOR PACKAGE AND ITS MANUFACTURING METHOD

BACKGROUND OF THE INVENTION

1. Field of the Invention

The present invention relates to a semiconductor package, such as a surface-mounted semiconductor package, which is mounted on the surface of a printed circuit board with input/output pins not inserted thereinto, and its manufacturing method.

2. Description of the Prior Art

Recently, a more sophisticated function of a semiconductor package, such as an IC package built into electronic devices including personal computers or the like, requires more numbers of input/output pins. As a matter of fact, the number of input/output pins per package has reached a few hundred.

One of those packages is a Quad Flat Package (QFP), where the input/output pins are arranged on four sides of the square package. However, as more and more input/output pins are used, the package must be increased in size to allow more pins to be arranged on its sides, thus requiring more space.

In order to arrange more pins in a limited space on this type of package, reduction of the pin-to-pin pitch is necessary. However, when the package is mounted on the printed circuit board, for example, by soldering, the input/output pins to be densely arranged sometimes causes electric shorts therebetween.

Figure 10:
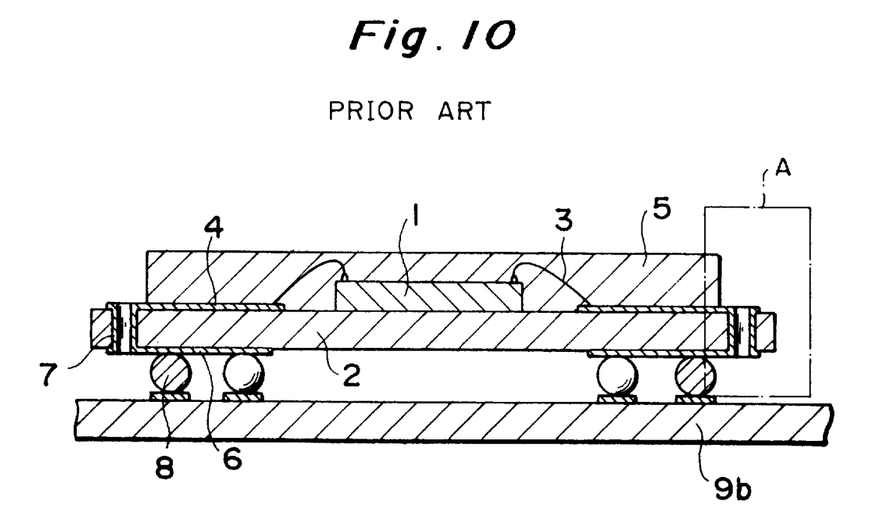
FIG. 10 is a cross sectional view of the conventional surface-mounted semiconductor package.
Figure 11A:
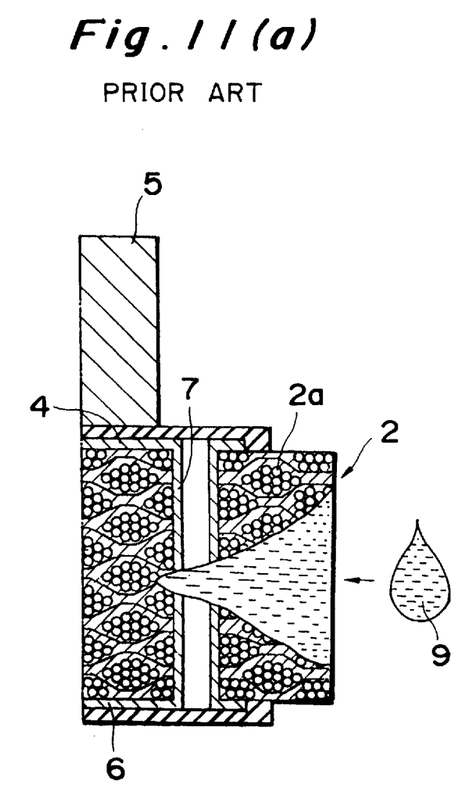
Figure 11B:
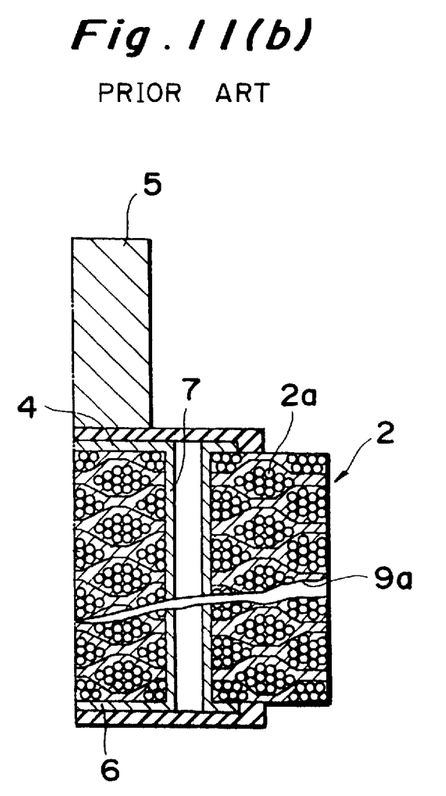

To solve this problem, a Ball Grid Array (BGA), shown in FIGS. 10, 11(a), and 11(b), has been introduced recently as a new type of package to allow more input/output terminals to be placed.

FIG. 10 is a cross sectional view of a conventional surface-mounted semiconductor package of a BGA type, and FIG. 11(a) and 11(b) are the enlarged sectional views of the part of the semiconductor package surrounded by the rectangle indicated by the symbol A in FIG. 10.

On the semiconductor package shown in FIG. 10, the semiconductor device 1 is attached by bonding, using, for example, adhesives, in a predetermined area on the substrate 2, which includes the stacked fibers 2a such as glass fibers bound by epoxy resin, as shown in FIG. 11(a) and FIG. 11(b). The electrode pads on the semiconductor device 1 are connected via the bonding wires 3 to the conductive patterns 4 on the substrate 2, and the semiconductor device 1 and the bonding wires 3 are sealed with the resin material 5.

On the bottom of the substrate 2 are formed the conductive patterns 6 which correspond to the conductive patterns 4. The corresponding conductive patterns 4 and 6 are electrically connected through the cylindrical conductive coatings 7 formed on the inside walls of the through-holes in the substrate 2. With both of-the semiconductor device 1 and the bonding wires 3 being sealed with the resin material 5, the bumps 8 to be made of material such as solder, are formed on the conductive pattern 6. The bumps 8, which serve like the input/output pins of the QFP, fix the semiconductor device 1 on the printed circuit board 9b, which an electric connection therebetween are performed.

Though the input/output pins of the QFP arranged in line on every side of the package, the bumps 8 of the BGA are placed on the bottom surface of the package in a matrix form. This placement of the BGA solves the problems of the QFP because the pitch between the bumps 8 may be widened.

However, the conventional surface-mounted semiconductor packages of the BGA type, has a drawback in that the water 9 easily pervades the substrate 2 composed of stacked fiber 2a, causing the substrate 2 to be crack.

In particular, once the bumps 8 are heated, so as to melt the bumps, when the package is mounted on the printed circuit board 9b, the water 9 lying in the substrate 2 expands rapidly through the heat of the bumps 8, sometimes causing a crack 9a to form in the substrate 2, as shown in FIG. 11(b). If the crack 9a reaches the cylindrical conductive coating 7 positioned near an edge of the substrate 2, the cylindrical conductive coating 7 is broken, thus breaking the electric connection.

SUMMARY OF THE INVENTION

It is an object of the present invention to provide a durable surface-mounted semiconductor package which prevents water with a possibility of causing problems such as a crack from pervading the edges of the substrate, and to provide its manufacturing method.

According to one aspect of the present invention, a surface-mounted semiconductor package mounted on the top of a printed circuit board basically comprises: an insulating substrate with a stack structure; a semiconductor device mounted on the top of the insulating substrate and having a plurality of electrode pads; a plurality of input/output terminals mounted on the bottom of the insulating substrate for connecting the semiconductor package to the printed circuit board; a plurality of conductive portion penetrating the insulating substrate in the direction of the thickness thereof for electrically connecting the input/output terminals to the electrode pads; and protecting means covering the sides of the insulating substrate and having a plurality of pairs of lands along the edges of the top and bottom of the insulating substrate.

The surface-mounted semiconductor package comprises the protecting means which covers the sides of the substrate, and as a result, prevents the pervading of water, peeling off and cracking of the substrate, and breaking of electric connection, as well as secures and fastens the peripheral edge portions of the substrate. Additionally, the surface-mounted semiconductor package avoids the infiltration of other foreign particles which cause damage to the substrate.

According to another aspect of the present invention, a method of manufacturing a surface-mounted semiconductor package with a semiconductor device, mounted on the top of a printed circuit board, basically comprises: making a plurality of elongated slots through a stack-structured insulating board, the plurality of slots being spaced from each other and surrounding the semiconductor device cooperatively; forming a metallic coating on the inside walls of each of the slots and on the opening edges of each of the slots on both top and bottom of the insulating board; and joining each of ends of every slot to nearer one of ends of adjacent slots to separate the area surrounded by the slots from the insulating board for use as a substrate.

After a metallic coating is formed on the inside wall of each of the slots and on the edges of the insulating board, the ends of two neighboring slots in each corner are joined to separate the substrate from the insulating board. Therefore, separating the substrate from the insulating board, and producing the protecting means to cover the sides and edges, i.e. the peripheral edge portions of the substrate are performed simultaneously, which brings efficient manufacturing.

BRIEF DESCRIPTION OF THE DRAWINGS

The present invention will be understood more fully from the detailed description and the accompanying drawings below of the preferred embodiments of the invention.

In the drawings:

FIG. 2 (*a*) is a cross sectional view of the surface-mounted semiconductor package in processing of die bonding, taken along a line II—II of FIG. 3;

FIG. 2 (*b*) is a cross sectional view of the surface-mounted semiconductor package in processing of wire bonding, taken along a line II—II of FIG. 3;

FIG. 2(*c*) is a cross sectional view of the surface-mounted semiconductor package in processing of molding, taken along II—II of FIG. 3;

FIG. 11(*a*) is an enlarged cross sectional view of the boxed part indicated by symbol A of FIG. 10; and FIG. 11(*b*) is another enlarged cross sectional view of the boxed part indicated by symbol A of FIG. 10.

DESCRIPTION OF THE PREFERRED EMBODIMENT(S)

Figure 1:
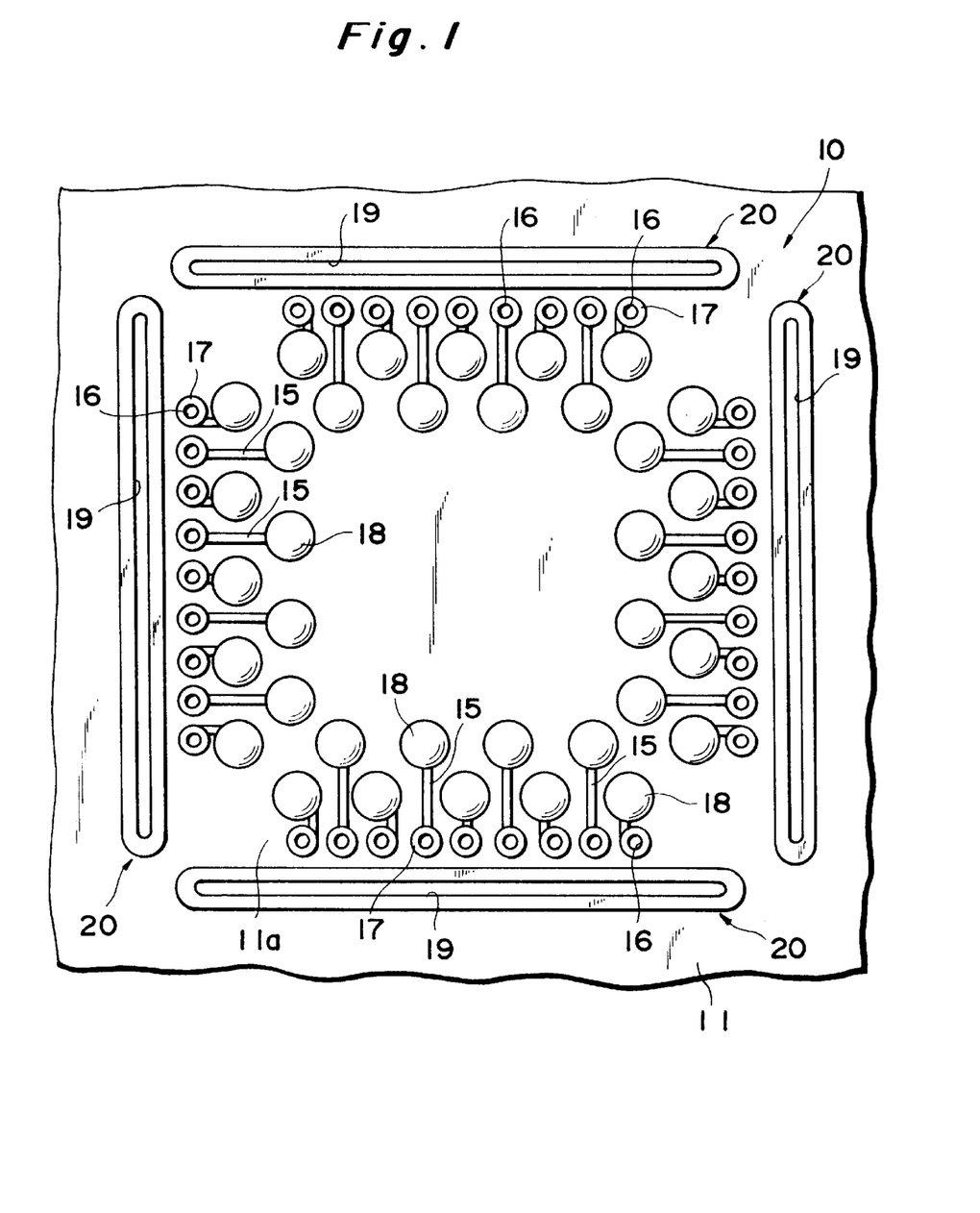
FIG. 1 is a bottom view of the surface-mounted semiconductor package in manufacturing process according to an embodiment of this invention.
Figure 2A:
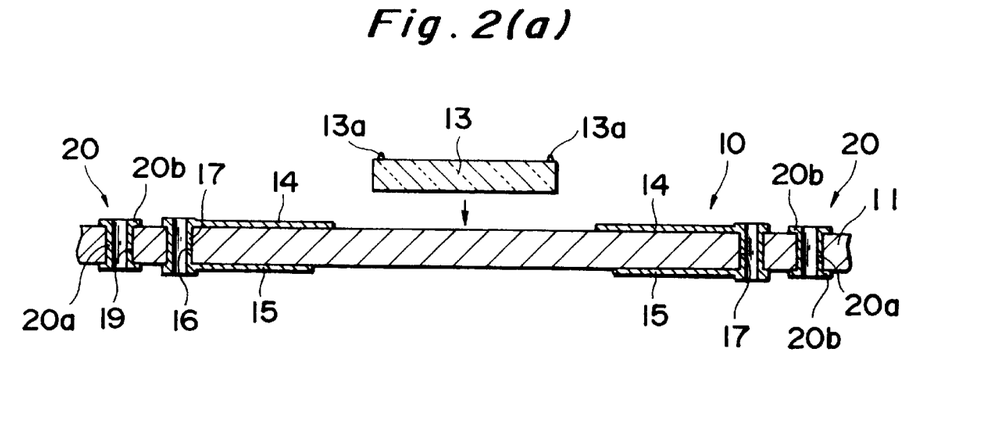
Figure 2B:
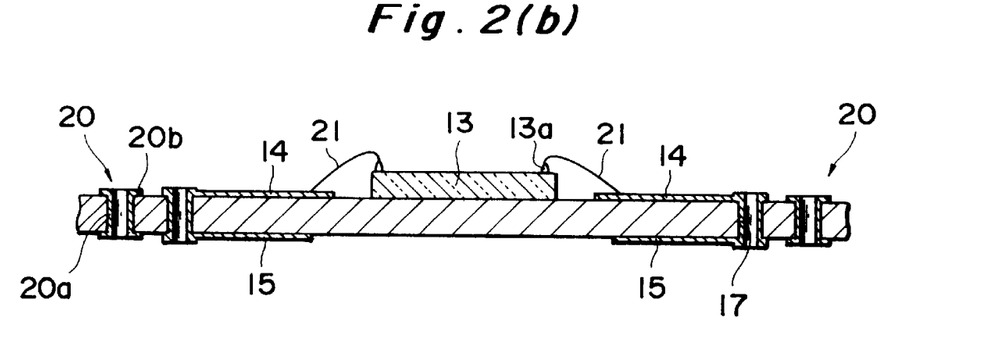
Figure 2C:
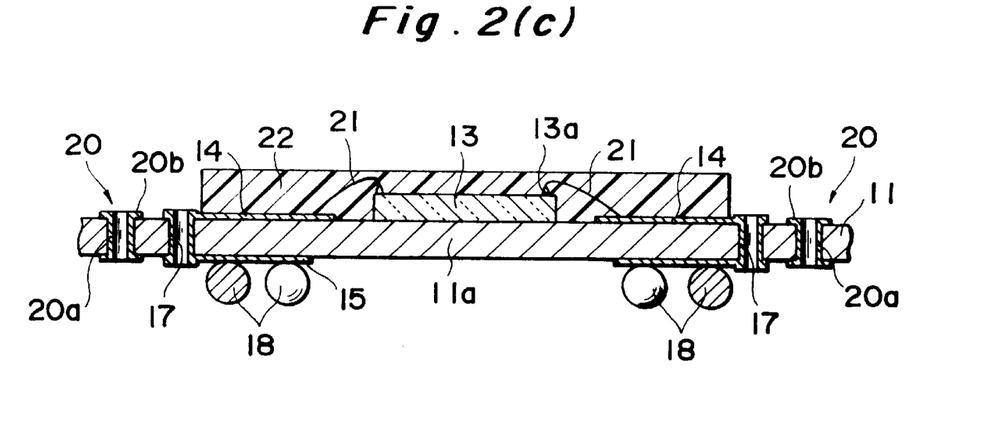

The surface-mounted semiconductor package 10 according to the present invention is assembled in a predetermined area(equivalent to substrate 11*a*) on the insulating board 11, as shown in FIGS. 1 and 2. As with a conventional semiconductor package, the insulating board 11, which includes many substrates 11*a*, is made of fibers 12 such as glass fibers to be stacked and bound together with adhesives such as epoxy resin (see FIG. 5).

In every predetermined area 11*a* of the insulating board 11, there are many conductive patterns 14 around a partial area of the predetermined area 11*a* in which the semiconductor device 13 such as an IC chip is mounted, as shown in FIG. 2 (*a*). These conductive patterns 14 correspond to the electrode pads 13*a* on the semiconductor device 13 respectively. On the bottom of the insulating board 11, there are also conductive patterns 15 corresponding to the conductive patterns 14.

Each of the conductive patterns 14 is electrically connected to its corresponding conductive pattern 15 through the conductive tube 17 made of metallic coatings, such as copper coatings, which is formed on the inside wall of the through-hole 16 going through the insulating board 11 vertically, i.e. in the direction of the thickness thereof. On each conductive pattern 15, a ball-like terminal 18 is attached, which connects the insulating board 11 to the printed circuit board 24 described later, and which serves as an input/output terminal of the surface-mounted semiconductor package 10. The through-hole 16 is made by drilling through the insulating board 11 using a tool such as a drill, and the conductive tube 17 is formed by plating the inside wall of the through-hole 16.

Figure 3:
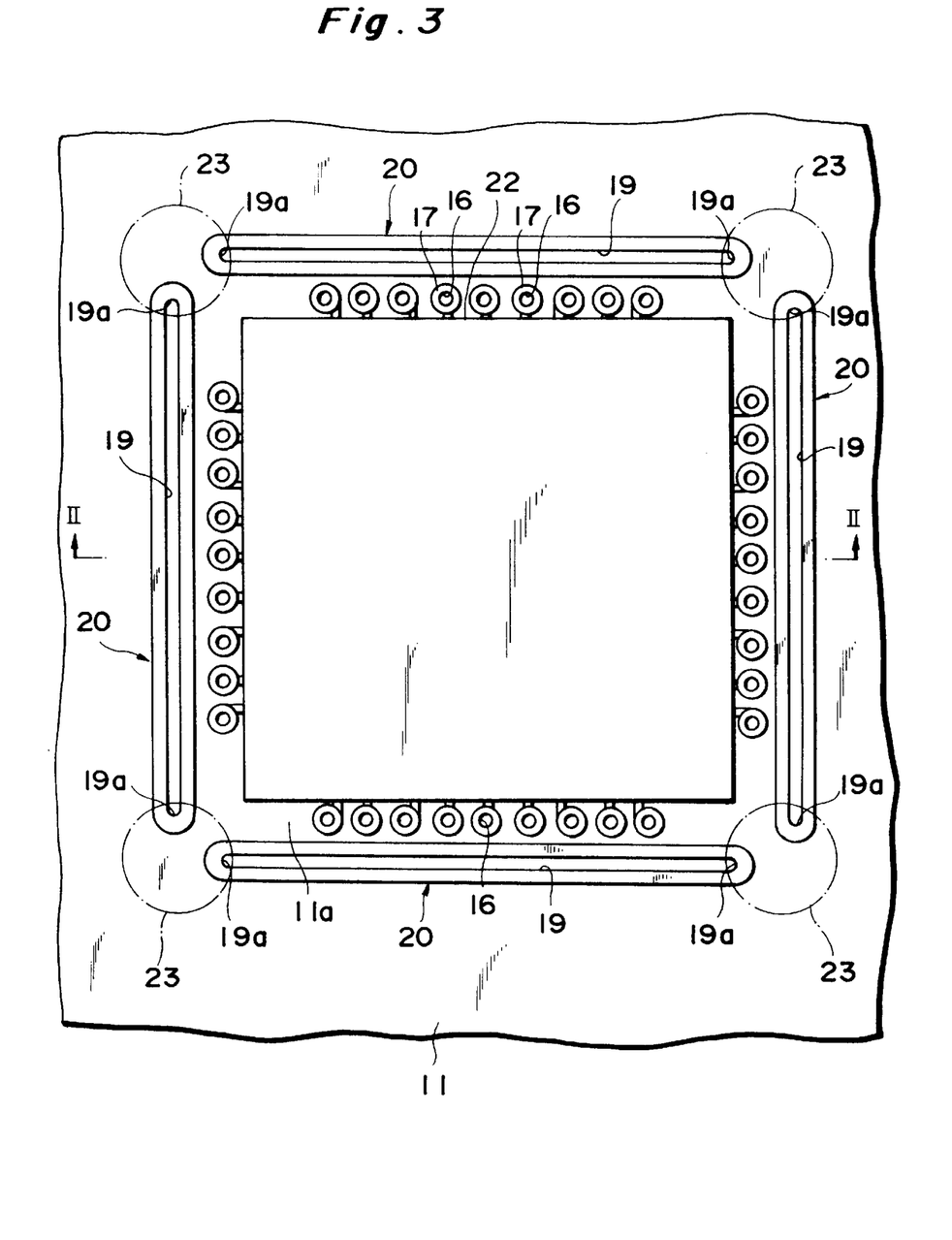
FIG. 3 is a top view of the surface-mounted semiconductor package of FIG. 1.

As shown in FIG. 1 and FIG. 3, there are four elongated slots 19 near the through-holes 16 on the insulating board 11, with their ends close each other. As with the through-holes 16, each slot 19 is drilled through the insulating board 11 vertically, and are preferably to be made at the same time the through-holes 16 are made. The inside wall and opening edges of the slot 19 on both sides of the insulating board 11 are all coated with the metallic coating 20. This metallic coating 20 is composed of two continuous parts: one is the cylindrical stem 20*a* which covers the inside wall of the slot 19, the other is the land 20*b* which covers the opening edges of the slot 19 on both sides of the insulating board 11.

It is desirable that this metallic coating 20 be formed as follows: First, thin metallic coating such as copper coating is formed on the inside wall and opening edges of the slot 19 through non-electrolytic plating. Next, masking the areas of coating corresponding to the stem 20*a* and the lands 20*b*, the other areas except for the above masking areas are removed by etching. The thin metallic coating on the stem 20*a* and on the lands 20*b* is developed by the electrolytic plating. The metallic coating on the inside wall of the stem 20*a* and on the lands 20*b* is completed. This metallic coating 20 is preferably to be made at the same time the conductive tube 17 is plated.

After a plurality of pairs of the stem 20*a* and the lands 20*b* connected to each other, are created on the insulating board 11 as well as the conductive patterns 14 and 15, the semiconductor device 13 is attached in the partial area abovementioned on the insulating board 11, that is, in the area which is surrounded by the above components, with a bonding means such as adhesives with the electrode pads 13*a* being upward, as shown FIG. 2 (*a*).

Then, as shown in FIG. 2 (*b*), each electrode pad 13*a* on the semiconductor device 13 is connected to the corresponding conductive pattern 14 with the bonding wire 21. Furthermore, as shown in FIG. 2 (*c*), the semiconductor device 13, the bonding wire 21, and part of the conductive patterns 14 are sealed with the sealing material 22 composed of synthetic resin. The terminals 18 which function as input/output pins of the surface-mounted semiconductor package 10 are attached on the conductive patterns 15 on the bottom of the insulating board 11.

The semiconductor package 10 is assembled on the insulating board 11 as described above. Then, in order to separate the surface-mounted semiconductor package 10 from the insulating board 11, all four corners of the substrate 11*a* are punched with the use of the round punch 23, as shown in FIG. 3, so that the both ends 19*a* of each slot 19 are removed. Namely, an end 19*a* is joined to an adjacent end 19*a*.

Punching the corners with the use of the punch 23 removes the ends 19*a* of each slot 19, causing part 11*a* of the insulating board 11 which is surrounded by four slots 19 and in which the semiconductor device 13 and conductive patterns 14 and 15 are mounted, to be separated from the insulating board 11. The separated part of the insulating board 11 is the substrate 11*a* of the surface-mounted semiconductor package 10. The surface-mounted semiconductor package 10 is separated from the insulating board 11 in this manner.

The surface-mounted semiconductor package 10 is connected to the wiring areas 24*a* lying on the surface of the printed circuit board 24 via the terminals 18 in a conventional fashion.

Figure 4:
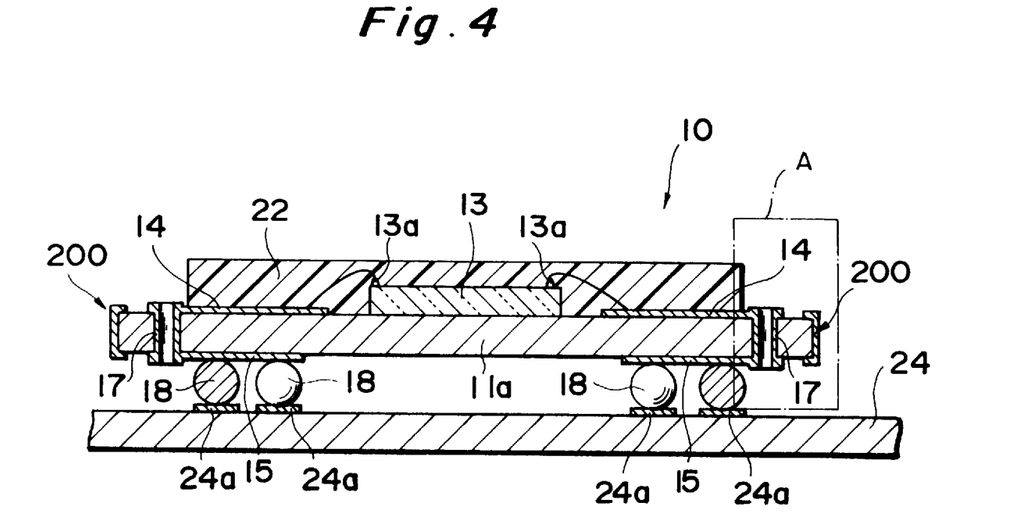
FIG. 4 is a cross sectional view of the complete surface-mounted semiconductor package of FIG. 1.

As, a result that the surface-mounted semiconductor package 10 is removed from the insulating board 11, the linear peripheral edge portions, that is, the sides and the edges of the substrate 11a, are covered by a part 200 of the metallic coating 20 formed on the inside wall and opening edges of each slot 19, as shown in FIG. 4. Except for the four corners of the substrate 11a, the part 200 of the metallic coating 20 extends along the linear peripheral edge portions of the substrate 11a. The stem 20a covers each side of the substrate 11a, while a pair of lands 20b cover the edges on the top and bottom of the substrate 11a. Part 200 forms a protecting means that protects the substrate 11a in such a manner.

Figure 5:
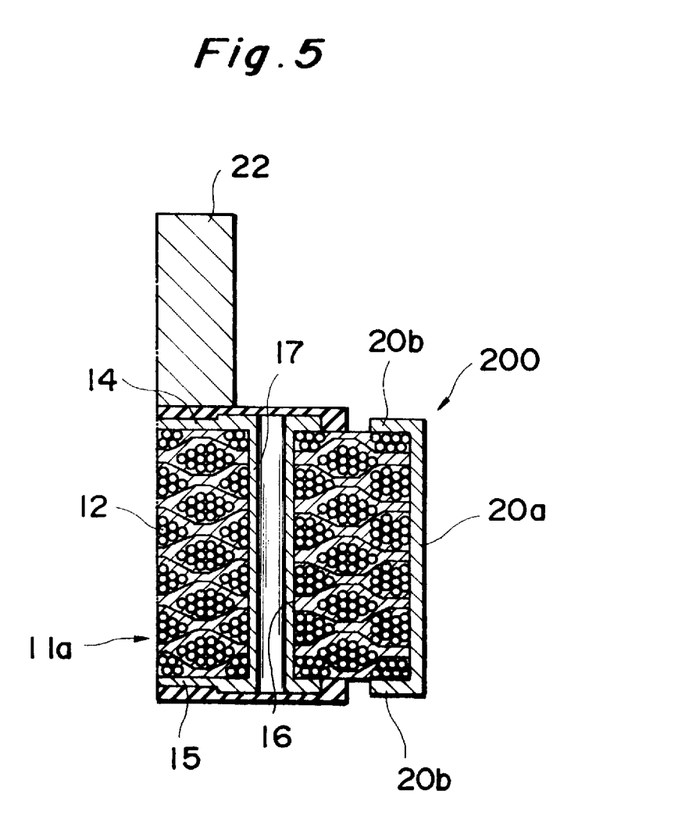
FIG. 5 is an enlarged cross sectional view of the boxed part indicated by symbol A of FIG. 4.

As shown in the enlarged diagram in FIG. 5, this protecting means 200 has the stem 20a to cover the sides of the substrate 11a, preventing water from infiltrating the substrate 11a. In addition, protecting means 200 has a pair of lands 20b extending from the stem 20a, and secures and fastens the edges of the substrate 11a, thus preventing the edges from being peeled off and the cracks from being caused and developed.

The surface-mounted semiconductor package 10 according to the present invention has the protecting means 200 to prevent water and other foreign matters from infiltrating the substrate 11a, and, additionally prevents the edge of the substrate 11a from being peeled off and the cracks from being caused. Therefore, the protecting means 200 prevents damage to the substrate 11a and furthermore, avoids electric disconnection due to damage in the conductive tube 17 caused by peeled edges or cracks in the substrate 11a, increasing the durability of the surface-mounted semiconductor package 10.

FIGS. 6 to 9 show the surface-mounted semiconductor package 110 used in another embodiment of the present invention. The same reference symbols are used for the components of the surface-mounted semiconductor package 110 that are functionally equivalent to those in the surface-mounted semiconductor package 10 shown in FIGS. 1 to 5.

Figure 9:
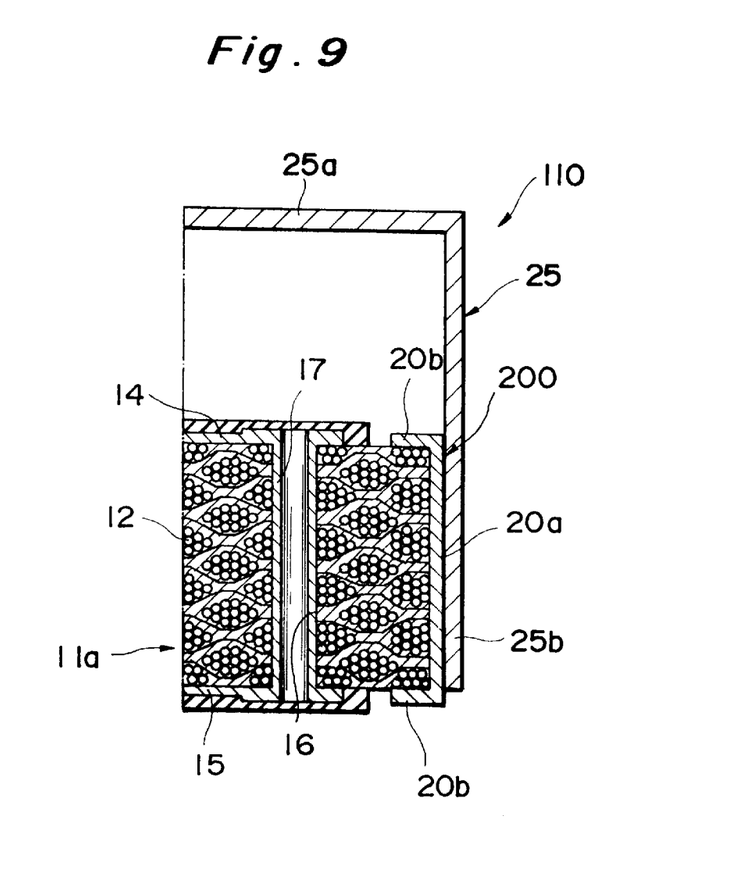
FIG. 9 is an enlarged cross sectional view of the boxed part indicated by symbol A of FIG. 8.

In the surface-mounted semiconductor package 110, the metallic cover 25 is used instead of the sealing material 22 in use for the surface-mounted semiconductor package 10. The lands 20b of the metallic coating 20, which are on the openings of the slot 19, are placed on the top and bottom of the insulating board 11, as shown in FIG. 9.

Figure 6:
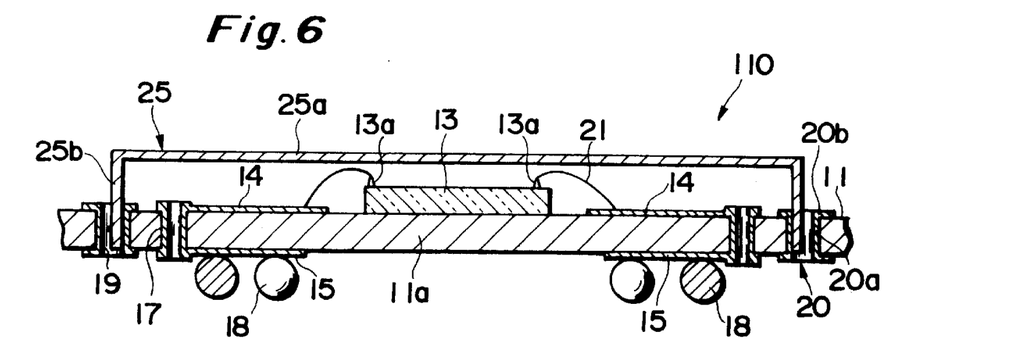
FIG. 6 is a cross sectional view of the surface-mounted semiconductor package, taken along a line VI—VI of FIG. 7.

As shown in FIG. 6, the conductive patterns 14 and 15, the conductive tubes 17 each connecting the corresponding conducting patterns 14, 15, the slots 19, and the metallic coatings 20 are formed on the insulating board 11 of the surface-mounted semiconductor package 110 as in the previous embodiment shown in FIG. 2(c). Then, the electrode pads 13a on the semiconductor device 13 are connected to the corresponding conductive patterns 14 via the bonding wires 21. Finally, the metallic cover 25 is mounted on the insulating board 11 to cover the semiconductor device 13, bonding wires 21, and conductive patterns 14.

The metallic cover 25 is composed of the flat, rectangle top 25a which covers the substrate 11a, and the sides 25b which extend downward from the four sides of the top 25a. Except for the four corners of the metallic cover 25, the bottom edges of the sides 25b are inserted into the slots 19. With its sides being inserted into the slots 19, the metallic cover 25 is fastened to the lands 20b on the top of the board 11, for example, by soldering.

A cover of some other materials such as synthetic resin may be used in stead of the metallic cover 25. In that case, however, the bonding means such as synthetic resin, is required to fasten the cover. On the contrary, the metallic cover 25 may be fixed to the metallic lands 20b by applying solder which is more powerful than any other bonding material made of synthetic resin, which enables the fastening of the metallic cover 25 to be more stiff or rigid.

Figure 7:
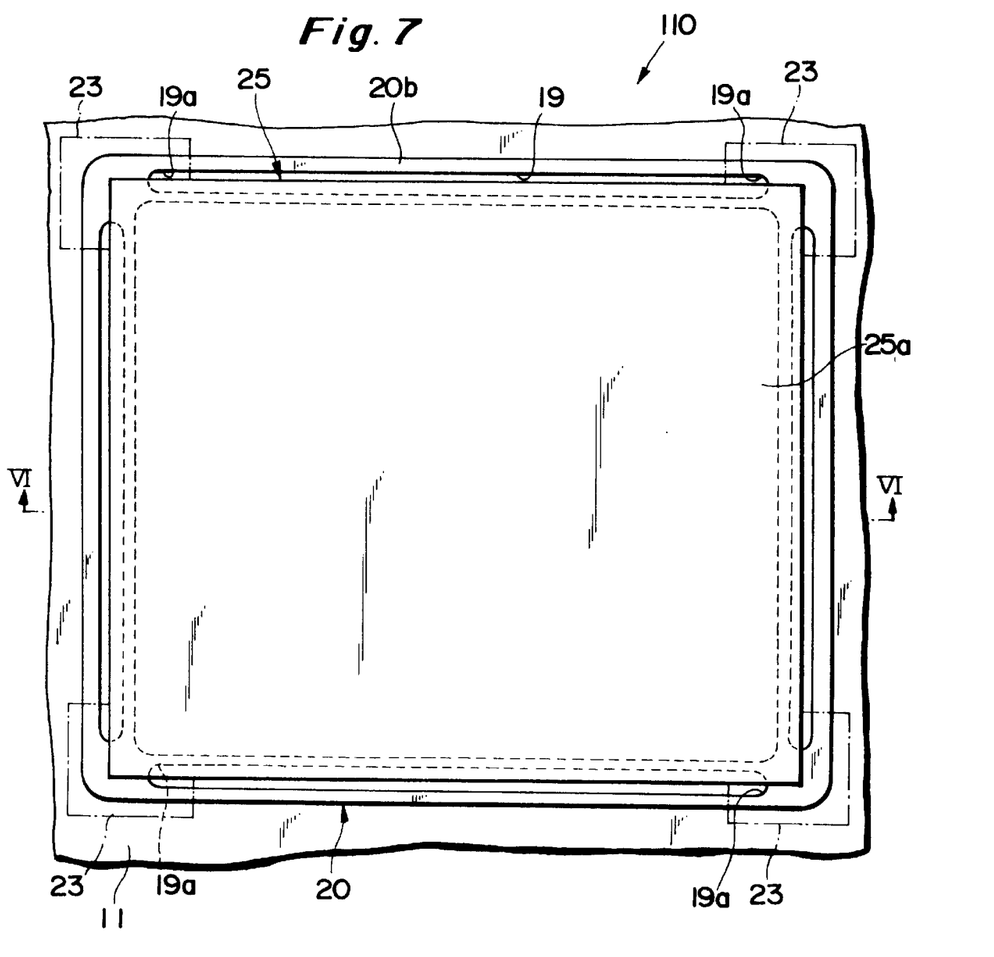
FIG. 7 is a top view of the surface-mounted semiconductor package according to another embodiment of this invention.

After mounting the metallic cover 25, the terminals 18 are attached to the conductive patterns 15 on the bottom of the insulating board 11. Then, as shown in FIG. 7, the ends 19a of each slot 19 on the insulating board 11 are punched with the punch 23 to remove the four corners of the substrate 11a. As shown in FIG. 7, the L-shaped punch 23 is used to punch the area of the insulating board 11 not covered by the metallic cover 25.

Figure 8:
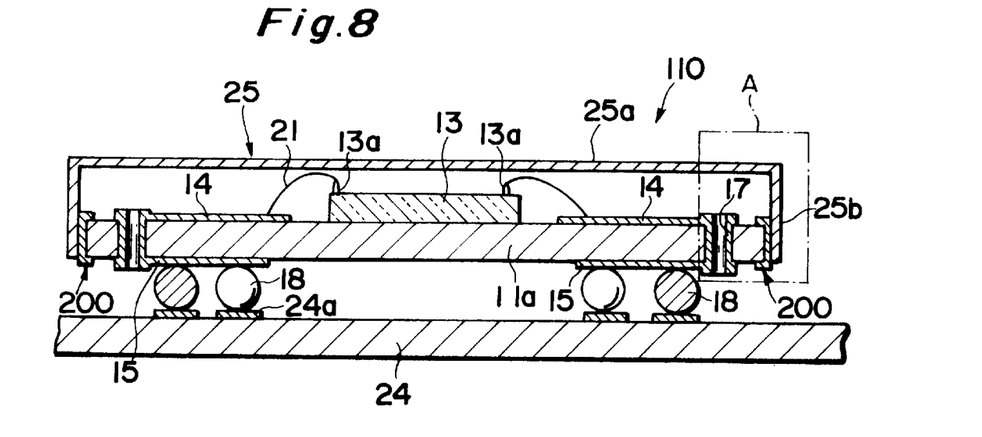
FIG. 8 is a cross sectional view of the complete surface-mounted semiconductor package of FIG. 7.

Punching the insulating board 11 with the use of the punch 23, which is shown in FIG. 8, separates from the insulating board 11 a part 11a of the insulating board 11 where the semiconductor device 13 and conductive patterns 14 are mounted. The separated part is the substrate 11a of the surface-mounted semiconductor package 110. The surface-mounted semiconductor package 110 is separated from the insulating board 11 in this manner.

As with the surface-mounted semiconductor package 10, a part 200 of the metallic coating 20 with the stem 20a and the lands 20b, which was originally formed as the inside wall and opening edges of the slot 19 is used as the protecting means. That is, the surface-mounted semiconductor package 110 has the stems 20a to cover the sides of the substrate 11a and the pairs of lands 20b to cover the edges on the top and bottom of the substrate 11a. Accordingly, the surface-mounted semiconductor package 110 obtains the same protection as that of the surface-mounted semiconductor package 10.

In order to separate the substrate 11a from the insulating board 11, various types of cutting means may be used instead of punching the insulating board 11 to remove or join the ends 19a of each slot 19.

In the above discussion, the embodiments in which the present invention is applied to a BGA-type package, where ball-like terminals are used. The present invention may be applied not only to this type of package but also to various types of surface-mounted semiconductor package with a multiple layers such as a PGA (Pin Grid Array), where pin-shaped terminals are used as the terminals 18.

What is claimed is:

1. A surface-mounted semiconductor package with a ball grid mountable array, and being on a top of printed circuit boards, comprising:

an insulating substrate comprised of bound fibers, the insulating substrate having a stack structure;

a semiconductor device mounted on a top of the insulating substrate and having a plurality of electrode pads;

a plurality of input/output meltable, ball-like terminals mounted on a bottom of the insulating substrate for attaching, by heating and melting the terminals, the semiconductor package to the printed circuit board;

a plurality of conductive portions penetrating the insulating substrate in a direction of a thickness thereof for electrically connecting the input/output terminals to the electrode pads, respectively;

a protecting metallic coating covering sides of the insulating substrate for preventing water from pervading the insulating substrate, and having a plurality of pairs of lands along edges of the top and bottom of the insulating substrate, and a stem portion covering the sides of said insulating substrate; and a metallic cover covering the semiconductor device, and being secured to the respective stem portions of said metallic coating.

2. A surface-mounted semiconductor package as set forth in claim 1, wherein the insulating substrate is rectangular-shaped, and the protecting coating is provided along linear peripheral portions of the insulating substrate except for four corners thereof.

* * * * *